United States Patent
Koskinen et al.

(10) Patent No.: US 12,085,611 B2
(45) Date of Patent: Sep. 10, 2024

(54) APPLICATIONS OF ADAPTIVE MICROELECTRONIC CIRCUITS THAT ARE DESIGNED FOR TESTABILITY

(71) Applicant: Minima Processor Oy, Oulu (FI)

(72) Inventors: Lauri Koskinen, Helsinki (FI); Navneet Gupta, Oulu (FI); Jesse Simonsson, Jorvas (FI)

(73) Assignee: Minima Processor Oy, Oulu (FI)

( * ) Notice: Subject to any disclaimer, the term of this patent is extended or adjusted under 35 U.S.C. 154(b) by 9 days.

(21) Appl. No.: 17/285,614

(22) PCT Filed: Oct. 16, 2018

(86) PCT No.: PCT/FI2018/050753
§ 371 (c)(1),
(2) Date: Apr. 15, 2021

(87) PCT Pub. No.: WO2020/079321
PCT Pub. Date: Apr. 23, 2020

(65) Prior Publication Data
US 2021/0318377 A1     Oct. 14, 2021

(51) Int. Cl.
*G01R 31/3177* (2006.01)
*G01R 31/317* (2006.01)
*G01R 31/3173* (2006.01)

(52) U.S. Cl.
CPC ... *G01R 31/3177* (2013.01); *G01R 31/31712* (2013.01); *G01R 31/31725* (2013.01); *G01R 31/3173* (2013.01)

(58) Field of Classification Search
None
See application file for complete search history.

(56) References Cited

U.S. PATENT DOCUMENTS 6,965,247 B2 * 11/2005 Nadal Guardia ......... G05F 1/46
324/762.09
7,072,781 B1 * 7/2006 Gershon .......... G01R 31/31908
324/426

(Continued)

FOREIGN PATENT DOCUMENTS

CN      1486506 A     3/2004
CN      101268615 A   9/2008

(Continued)

OTHER PUBLICATIONS

International Search Report for corresponding International Patent Application No. PCT/FI2018/050753 dated Sep. 24, 2019, 6 pages.

(Continued)

*Primary Examiner* — Guerrier Merant
(74) *Attorney, Agent, or Firm* — Merchant & Gould P.C.

(57) ABSTRACT

The performance of a microelectronic circuit can be configured by making an operating parameter assume an operating parameter value. An operating method comprises selectively setting the microelectronic circuit into a test mode that differs from a normal operating mode of the microelectronic circuit, and utilizing said test mode to input test input signals consisting of test input values into one or more adaptive processing paths within the microelectronic circuit. An adaptive processing path comprises processing logic and register circuits configured to produce output values from input values input to them. The performance of such an adaptive processing path can be configured by making an operating parameter assume an operating parameter value. The method comprises making said one or more adaptive processing paths form test output values on the basis of the respective test input values input to them, and forming a set of test output signals by collecting said test output values given by said one or more adaptive processing paths. The method comprises examining said set of test (Continued)

output signals, and forming a test result on the basis of said examining, and using said test result to select and set an operating parameter value for said operating parameter.

19 Claims, 12 Drawing Sheets

(56) References Cited

U.S. PATENT DOCUMENTS

| | | | |
|---|---|---|---|
| 9,046,573 B1* | 6/2015 | Watt | G06F 30/30 |
| 2007/0164787 A1 | 7/2007 | Grochowski et al. | |
| 2008/0052585 A1* | 2/2008 | LaBerge | G01R 31/31935 |
| | | | 714/738 |
| 2010/0299557 A1 | 11/2010 | Bull et al. | |
| 2012/0304030 A1 | 11/2012 | Haufe | |
| 2014/0157065 A1* | 6/2014 | Ong | G06F 15/7821 |
| | | | 714/718 |
| 2016/0087612 A1 | 3/2016 | Ito et al. | |
| 2016/0103704 A1* | 4/2016 | Suzuki | G06F 9/4812 |
| | | | 710/260 |
| 2016/0154055 A1 | 6/2016 | Leibowitz et al. | |
| 2016/0349316 A1 | 12/2016 | Miro Panades | |

FOREIGN PATENT DOCUMENTS

| | | |
|---|---|---|
| CN | 102798810 A | 11/2012 |
| TW | 200819769 A | 5/2008 |
| WO | WO 2007/038033 A2 | 4/2007 |
| WO | WO 2018/193150 A1 | 10/2018 |

OTHER PUBLICATIONS

Written Opinion of the International Searching Authority for corresponding International Patent Application No. PCT/FI2018/050753 dated Sep. 24, 2019, 9 pages.

Fuketa, H. et al., "Trade-off analysis between timing error rate and power dissipation for adaptive speed control with timing error prediction", Design Automation Conference, IEEE, 266-271 (Jan. 2009).

Wirnshofer, M. et al., "A variation-aware adaptive voltage scaling technique based on in-situ delay monitoring", Design and Diagnostics of Electronic Circuit & Systems (DDECS), IEEE, 261-266 (Apr. 2011).

Office Action of May 5, 2023 for the corresponding Taiwanese patent application 108137059 (12 pages including English Translation).

Office Action dated Dec. 1, 2023 in the corresponding Chinese patent application 201880098721.7 (16 pages including English Translation).

* cited by examiner

APPLICATIONS OF ADAPTIVE MICROELECTRONIC CIRCUITS THAT ARE DESIGNED FOR TESTABILITY

This application is a National Stage Application of PCT/FI2018/050753, filed 16 Oct. 2018, and which application is incorporated herein by reference. To the extent appropriate, a claim of priority is made to the above disclosed application.

FIELD OF THE INVENTION

The invention applies in general to the technical field of microelectronic circuits and circuit elements. In particular the invention applies to adaptive microelectronic circuits and circuit elements that are designed for testability.

BACKGROUND OF THE INVENTION

Microelectronic circuits, such as microprocessors, microcontrollers, and the like, operate basically by passing large numbers of digital values through numerous processing paths in a particular way determined by programmed instructions. The processing paths typically comprise pieces of programmable logic, between which there are register circuits for temporarily storing the digital values at a rate defined by a clock signal. A microelectronic circuit can also be called a microelectronic system, although the concept of a microelectronic system can also be used to refer to a device that comprises several microelectronic circuits.

In order to ensure that a microelectronic circuit or system operates appropriately it must be possible to test its operation. The concept of DFT (Designed For Testability, or Design-For-Test) has become an established collective definition of a number of practices or de facto standards that tell, how the designer of a microelectronic circuit may ensure testability. As an example, it should be possible to selectively couple the register circuits contained in the microelectronic circuit into long chains that operate essentially as shift registers: a string of digital values can be fed in from one end and read out from the other end. Passing a known test pattern through such a chain of register circuits and checking its form at the output tells whether all register circuits in the chain are changing their states as desired or whether there are register circuits that are stuck at some particular value (stuck-at fault test). An at-speed fault test involves feeding in a test pattern slowly at a low clock speed, then giving one or more clock pulses at the full operating speed so that the test pattern proceeds in the chain at functional logic speed by as many steps as there are clock pulses, and finally clocking the test pattern out again at a low clock speed. The at-speed test may give information about register circuits that are slower than intended.

While the DFT methodology is good for example for acceptance testing of manufactured circuits and for some run-time monitoring of correct operation of microelectronic systems, its known applications do not give optimal tools for example concerning performance optimization or characterization of circuits and circuit elements.

SUMMARY

An objective of the invention is to present a method, a microelectronic circuit, and a microelectronic circuit element that make it possible to use DFT methodologies for performance optimization and characterization of circuits and circuit elements.

The objective of the invention is achieved by making the microelectronic circuit adaptive, i.e. equipping it with adaptive circuit elements, so that adaptation of the values of operating parameters can be combined with DFT methodologies.

According to an aspect of the invention there is provided a method for operating an adaptive microelectronic circuit. Its performance can be configured by making an operating parameter assume an operating parameter value. The method comprises selectively setting the microelectronic circuit into a test mode that differs from a normal operating mode of the microelectronic circuit, and utilizing said test mode to input test input signals consisting of test input values into one or more adaptive processing paths within the microelectronic circuit. An adaptive processing path comprises processing logic and register circuits configured to produce output values from input values input to them. The performance of such an adaptive processing path can be configured by making an operating parameter assume an operating parameter value. The method comprises making said one or more adaptive processing paths form test output values on the basis of the respective test input values input to them, and forming a set of test output signals by collecting said test output values given by said one or more adaptive processing paths. The method comprises examining said set of test output signals, and forming a test result on the basis of said examining, and using said test result to select and set an operating parameter value for said operating parameter.

According to an embodiment the operating parameter value that is set is made to affect the performance of said one or more adaptive processing paths. This involves the advantage that the adaptivity of the circuit can be utilized in many situations, even dynamically during operation.

According to an embodiment the method comprises characterizing said microelectronic circuit by consecutively setting at least a first and a second operating parameter value for said operating parameter, forming a first test result on the basis of examining a first set of test output signals formed when said operating parameter had said first operating parameter value, forming a second test result on the basis of examining a second set of test output signals formed when said operating parameter had said second operating parameter value, and forming a characterization value indicative of difference between said first and second test results. This involves the advantage that the advantageous effect on the operation and performance of the microelectronic circuit can be verified and quantified.

According to an embodiment the method comprises characterizing an adaptive processing path within said microelectronic circuit by setting said first and second operating parameter values such that said first operating parameter value has a different effect on the performance of said adaptive processing path than said second operating parameter value. This involves the advantage that the effect of the operating parameter values can be quantified.

According to an embodiment the method comprises binning the microelectronic circuit into a performance bin on the basis of said characterization value. This involves the advantage that the value of individual microelectronic circuits can be set according to the extent to which they fill their intended specifications.

According to an embodiment said performance bin is at least one of the following: a voltage bin for microelectronic circuits for which the corresponding characterization value indicates acceptable minimum operating voltage for a given clock speed, a clock speed bin for microelectronic circuits for which the corresponding characterization value indicates acceptable maximum clock speed at a given operating voltage, an energy bin for microelectronic circuits for which the corresponding characterization value indicates acceptable energy consumption for a combination of a minimum operating voltage and maximum clock speed. This involves the advantage that a manufacturer of electronic devices may pick microelectronic circuits that best suit the particular needs in a particular kind of an electronic device.

According to an embodiment said adaptive register circuit comprises a register input, a clock input, a register output, and a timing event output; said adaptive register circuit comprises a data storage between said register input and said register output for temporarily storing a data value appearing at said register input at an allowable time limit in relation to a clock signal appearing at said clock input; said adaptive register circuit comprises a timing event observation stage configured to output a timing event observation signal at said timing event output in response to a change in the data value at said register input that took place later than said allowable time limit in relation to said clock signal; and the method step of forming a set of test output signals comprises collecting output values given by said timing event observation stage. This involves the advantage that the operation of the timing event observation stage can be tested according to DFT principles.

According to an embodiment the method comprises freezing the value of said timing event observation signal for a longer period than one clock cycle in said clock signal, for later collection of the frozen value of said timing event observation signal to form said set of test output signals. This involves the advantage that the collection of timing event observation signals in testing is not required to mandatorily operate at full clock speed.

According to an embodiment the method comprises temporarily disabling operation of said timing event observation stage, inputting said test input values through said register input into said data storage, and collecting the test output values given at said register output; for testing the operation of the data storage independent of the operation of the timing event observation stage. This involves the advantage that the operation of the data storage can be tested independent of the operation of the timing event observation stage.

According to an embodiment said test mode comprises at least one standardized DFT test mode, including but not being limited to stuck-at-fault testing, at-speed-fault testing. This involves the advantage that the method is compatible with commonly used DFT principles.

According to another aspect there is provided a microelectronic circuit that comprises a processing path. Said processing path comprises circuit elements such as processing logic and register circuits, and said processing path is adaptively responsive to values of operating parameters made available to said circuit elements. The microelectronic circuit comprises a test input arrangement configured to controllably feed test input signals consisting of test input values into a plurality of circuit elements of said processing path. The microelectronic circuit comprises a test output arrangement configured to controllably collect test output values from said plurality of circuit elements of said processing path, and an operating parameter value selector configured to select said values of said operating parameters on the basis of said collected test output values.

According to an embodiment one of said circuit elements is a register circuit that comprises a first subregister stage and a second subregister stage in series along a data propagation path; said register circuit comprises a triggering event input for receiving a triggering signal, a triggering edge of which is to define an allowable time limit before which a digital value must be appear at a data input of said first subregister stage to become temporarily stored; and said register circuit comprises a timing event observation stage coupled to said data propagation path and configured to output a timing event observation signal at an output of said register circuit as an indicator of said digital value at said data input having changed within a time window that begins at said allowable time limit and is shorter than one cycle of said triggering signal. This involves the advantage that time borrowing can be done in such a register circuit successfully and with an indication of performed time borrowing being available for further processing and conclusions.

According to an embodiment said test output arrangement is configured to controllably collect test output values from a data output of said register circuit that is an output of said second subregister stage. This involves the advantage that the correct operation of the register circuit can be tested according to DFT principles.

According to an embodiment said test output arrangement is configured to controllably collect values of said timing event observation signal as said test output values. This involves the advantage that the correct operation of the timing event observation stage can be tested according to DFT principles.

According to an embodiment said operating parameters comprise at least one of: an operating voltage, a clock speed. This involves the advantage that the operation of the microelectronic circuit can be adapted in various ways.

According to yet another aspect there is provided a register circuit for temporarily storing a digital value obtained from an output of a preceding circuit element in a microelectronic circuit. The register circuit comprises a data input for receiving said digital value for temporary storage, and a data output for outputting the temporarily stored digital value. The register circuit comprises a triggering event input for receiving a triggering signal, a triggering edge of which defines an allowable time limit before which a digital value must appear at said data input to become temporarily stored, and on the data propagation path between said data input and data output a sequence of a first subregister stage and second subregister stage. Said first subregister stage is configured to receive said triggering signal delayed with respect to the triggering signal received by said second subregister stage, the length of the delay being a fraction of a cycle of said triggering signal. Said register circuit comprises a timing event observation logic configured to output a timing event observation signal at an output of said register circuit as an indicator of said digital value at said data input having changed within a time window that begins at said allowable time limit and is shorter than one cycle of said triggering signal. Said register circuit is adaptively responsive to values of operating parameters made available to said register circuit.

According to yet another aspect there is provided a monitor circuit for detecting timing events in a register circuit of a microelectronic circuit. The monitor circuit comprises a triggering event input for receiving a triggering signal, a triggering edge of which defines an allowable time limit before which a digital value must appear at a data input of said register circuit to become temporarily stored in said register circuit. The monitor circuit comprises a monitoring input for receiving a monitoring copy of said digital value at the same timing as at which said digital value appears at said data input of said register circuit. The monitor circuit comprises a timing event observation output, and a timing event observation logic configured to output a timing event observation signal at said timing event observation output as an indicator of said digital value at said data input having changed within a time window that begins at said allowable time limit and is shorter than one cycle of said triggering signal. The monitor circuit comprises an output handling unit configured to enable collecting values of said timing event observation signal for further processing outside the monitor circuit. Said monitor circuit is adaptively responsive to values of operating parameters made available to said monitor circuit.

According to an embodiment said output handling unit comprises a control input for receiving an output freezing command, wherein said monitor circuit is configured to respond to a received output freezing command by holding a current value of said timing event observation signal constant. This involves the advantage that the collection of timing event observation signals in testing is not required to mandatorily operate at full clock speed.

According to an embodiment said output handling unit comprises a multiplexer configured to selectively direct a value of said timing event observation signal to a scanning chain outside said monitor circuit instead of a data output value of said register circuit. This involves the advantage that a single scanning chain can be utilized for both purposes.

BRIEF DESCRIPTION OF THE DRAWINGS

The accompanying drawings, which are included to provide a further understanding of the invention and constitute a part of this specification, illustrate embodiments of the invention and together with the description help to explain the principles of the invention. In the drawings.

DETAILED DESCRIPTION

An adaptive microelectronic circuit or system is one in which the values of operating parameters can be changed during operation to optimize performance in one way or another. The most important operating parameters are the operating voltage and the clock speed. The last-mentioned determines the rate at which the digital values appearing at the inputs of register circuits are stored and made available at the outputs of the register circuits.

In order to minimize the energy consumption of the microelectronic circuit it would be advantageous to make the operating voltage as low as possible. The operating voltage cannot be made arbitrarily low though, because a lower operating voltage causes slower transitions between states in the circuit elements, which in turn may cause timing errors and indefinite states. However, the minimum value of operating voltage at which satisfactory performance of the microelectronic circuit can be maintained is not necessarily constant, but may vary depending on e.g. a temperature of the system, criticality of data to be processed, the nature of the processing operations that should be performed, or the like. Adaptivity with respect to operating voltage means that the value of the operating voltage may be dynamically changed, while simultaneously using some monitoring mechanism to ensure that certain measures or performance, like the occurrence of processing errors or timing events, remain within certain acceptable limits.

Adaptive clock speed can be used in many ways to optimize performance. A high clock speed naturally makes processing faster, because the processed data moves quicker through the processing paths of the microelectronic circuit. At the same time a high clock speed is known to increase energy consumption and make timing events occur more frequently. Adaptivity with respect to clock speed may involve making the clock speed high when rapid processing is desired and slowing it down when minimizing energy consumption is a priority. Operating voltage and clock speed may also be adapted simultaneously in order to find an optimum working point at which the energy consumption of the microelectronic circuit is at a minimum in relation to the rate at which the circuit processes data.

Figure 1:
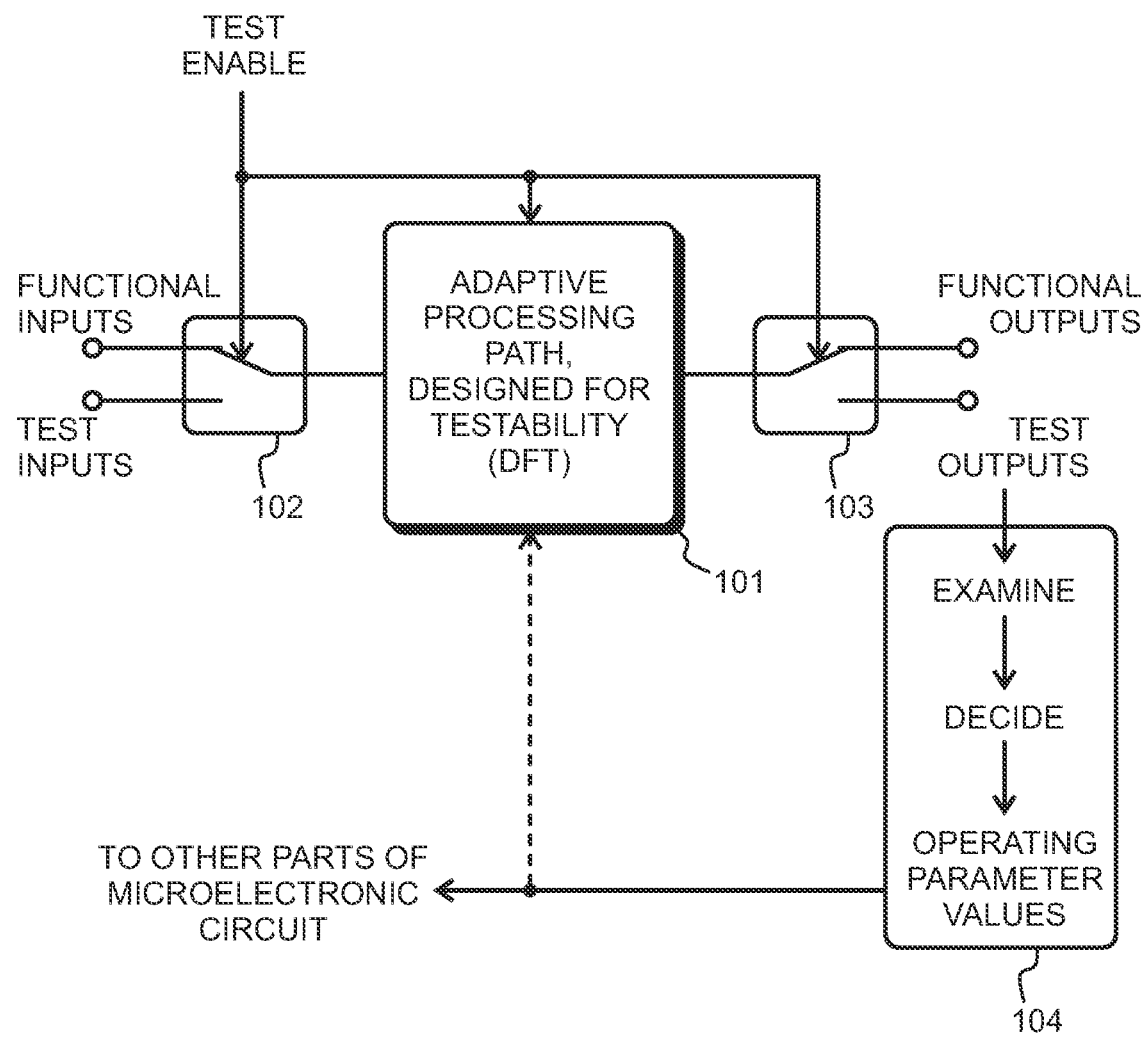
FIG. 1 illustrates the concepts of adaptability and DFT in a microelectronic circuit.

FIG. 1 is a schematic illustration of an adaptive microelectronic circuit. The drawing can also be examined as a schematic illustration of a method for operating an adaptive microelectronic circuit. In this description the fact that the microelectronic circuit is adaptive means that the performance of the microelectronic circuit can be configured by making an operating parameter assume an operating parameter value. Examples of such operating parameters include, but are not limited to, operating voltage and clock speed.

The adaptive microelectronic circuit comprises one or more adaptive processing paths 101. A processing path in general comprises processing logic and register circuits and is configured to produce output values from input values input to it. Typically in a normal operating mode the processing logic and register circuits are arranged in alternating manner so that a digital value temporarily stored in a first register circuit is fed into a first piece of processing logic, the resulting processed value is temporarily stored in a second register from which it is fed into a second piece of processing logic and so on. A processing path is an adaptive processing path if one or more of its circuit elements is adaptive, so that said processing path becomes adaptively responsive to values of operating parameters made available to said one or more circuit elements.

The adaptive microelectronic circuit of FIG. 1 is also DFT, meaning Designed For Testability. This means that one or more of its adaptive processing paths 101 can be selectively set into a test mode that differs from the normal operating mode. An example of setting an adaptive processing path into a test mode comprises coupling a number of register circuits into a scan chain so that together they operate like a shift register in the test mode.

In the schematic representation of FIG. 1 the setting into test mode takes place by activating a TEST ENABLE signal. FIG. 1 shows three possible effects of activating the TEST ENABLE signal. First, it may affect the way in which input signals are provided to the adaptive processing path 101: instead of inputting so-called functional input signals as in normal mode, the test mode is utilized to input test input signals consisting of test input values into one or more adaptive processing paths 101 within the microelectronic circuit. Second, it may affect the way in which the test input values are handled within the adaptive processing path 101, making the one or more adaptive processing paths form test output values on the basis of the respective test input values input to them. Third, it may affect the way in which the test output values given by the one or more adaptive processing paths are collected and formed into a set of test output signals.

The adaptive microelectronic circuit comprises a test input arrangement that is configured to controllably feed test input signals consisting of test input values into a plurality of circuit elements of the adaptive processing path 101. The first switch 102 is a schematic illustration of how activating the TEST ENABLE signal affects the way in which input signals are provided: instead of feeding in functional input signals as in the normal operating mode, test input signals are fed in. A test input signal can be for example a known vector, i.e. a known sequence of digital values (0's and 1's) in a particular order.

The adaptive microelectronic circuit comprises a test output arrangement that is configured to controllably collect test output values from the plurality of circuit elements of the adaptive processing path 101. The second switch 103 is a schematic illustration of how activating the TEST ENABLE signal affects the way in which output values are handled: instead of directing the output value into some further processing or otherwise using it as in normal operating mode, the test output values are collected to form test output signals that can be examined. On the basis of such examining a test result is formed, indicating how the test went, i.e. whether the test revealed any anomalies or errors in the operation of the adaptive processing path 101.

Examples of how activating the TEST ENABLE signal may affect the way in which the test input values are handled within the adaptive processing path 101 are described in more detail later in this text. It should be noted that even if FIG. 1 illustrates only a single TEST ENABLE signal, this is just an illustrative simplification. There may be separate TEST ENABLE signals to the different parts of the adaptive microelectronic circuit that are shown in FIG. 1, and these may be operated independent of each other or with only some coherence with each other, depending on what kind of testing is to be done and what is to be achieved.

In the approach shown in FIG. 1 the concepts of DFT and adaptivity are combined. This means that the test result can be used to select and set one or more new values for one or more operating parameters of the adaptive microelectronic circuit. FIG. 1 shows schematically an operating parameter value selector 104 that is configured to select the values of the operating parameter(s) on the basis of said collected test output values. The operating parameter values that are selected and set can be made to directly affect the performance of the one or more adaptive processing paths 101 from which the test output signals were collected. This is illustrated with the dashed arrow in FIG. 1. Additionally or alternatively the operating parameter values that are selected and set can be made to affect the performance of other parts of the adaptive microelectronic circuit.

Figure 2:
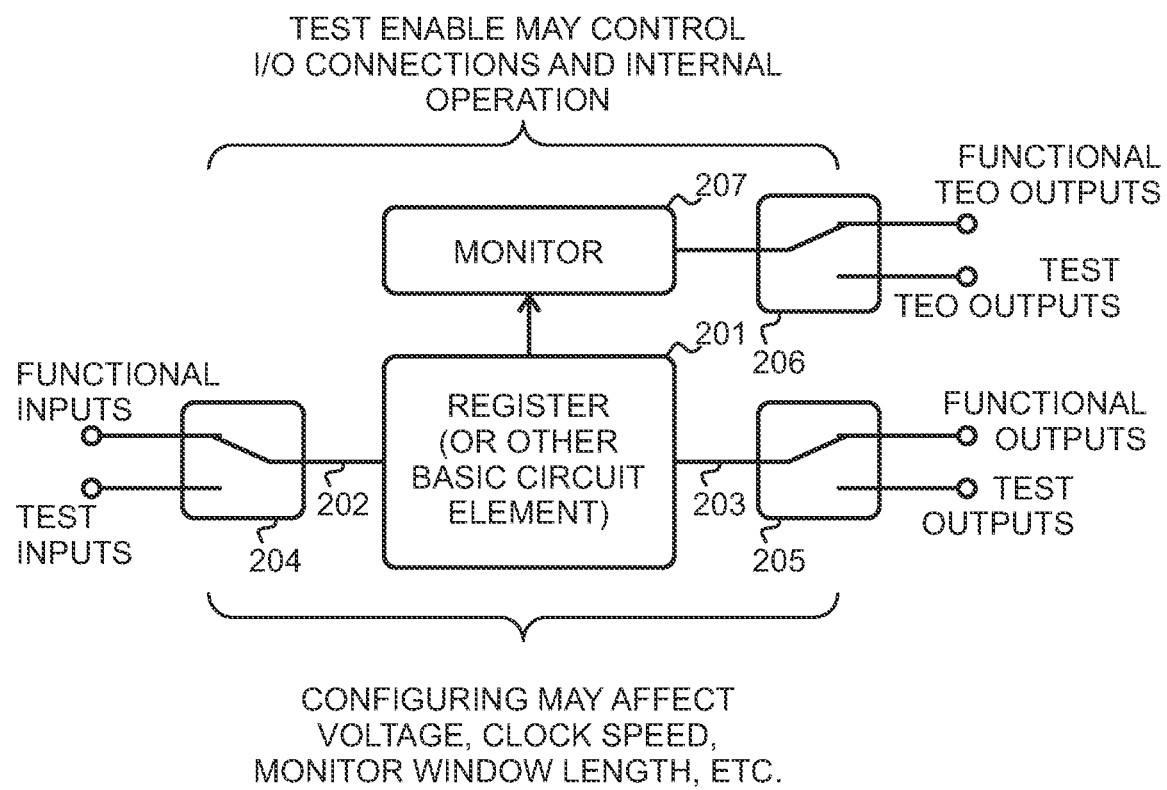
FIG. 2 illustrates schematically the use of an adaptive monitor circuit.
Figure 3:
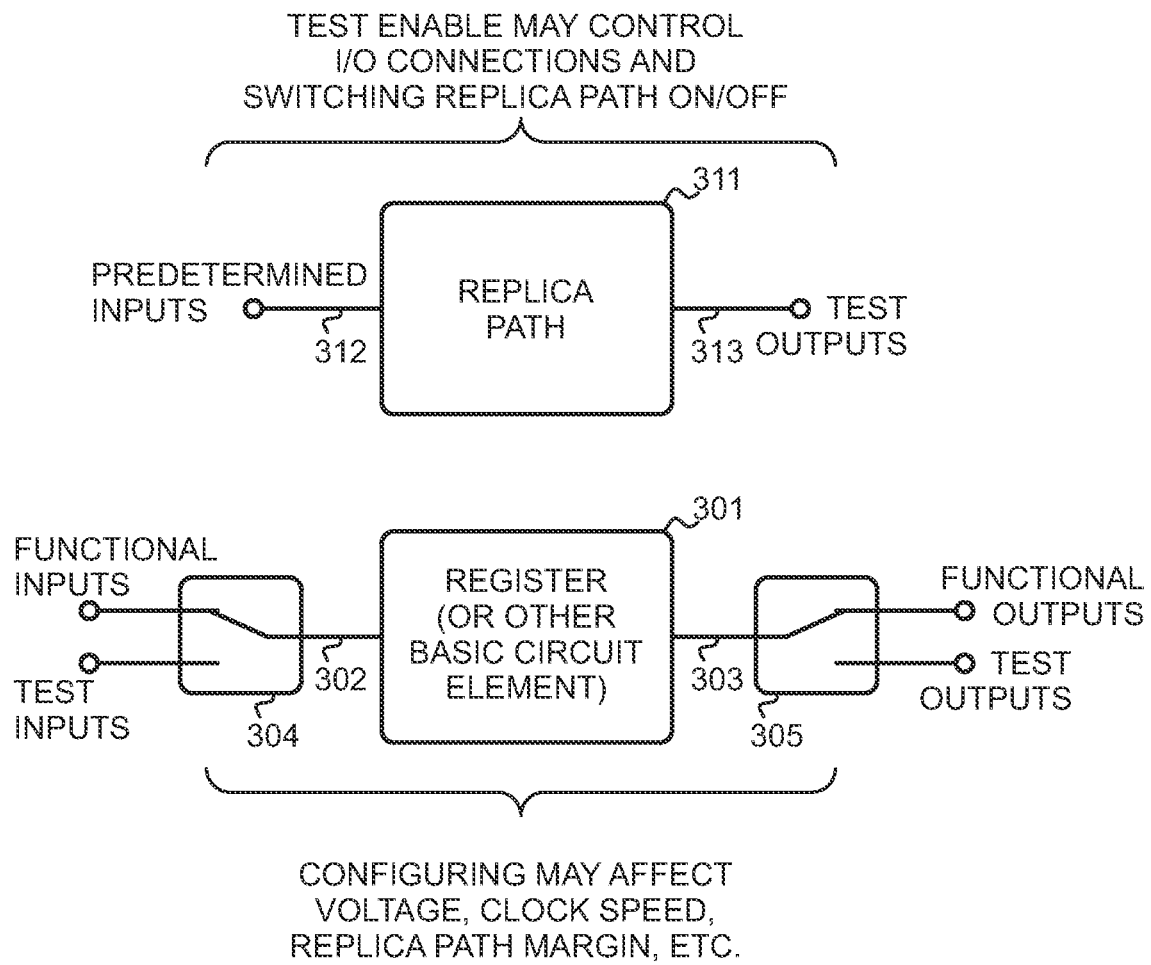
FIG. 3 illustrates schematically the use of a replica path.

FIGS. 2 and 3 illustrate some slightly more detailed examples in which DFT and adaptivity can be combined on the level of circuit elements.

FIG. 2 illustrates schematically an adaptive register circuit that can be a part of an adaptive processing path in an adaptive microelectronic circuit. The register circuit proper, i.e. the temporary storage for a digital value, is shown as 201. It has a data input 202 for receiving a digital value for temporary storage, and a data output 203 for outputting the temporarily stored digital value. A test input arrangement of the adaptive microelectronic circuit is represented by the first switch 204, which can be used to selectively couple functional input signals (during normal operating mode) or test input signals (during test mode) to the data input 202. A test output arrangement of the adaptive microelectronic circuit is represented by the second switch 205 and the third switch 206. Both of these are configured to controllably collect test output values from the adaptive register circuit to form test output signals.

The adaptive register circuit may comprise other inputs, which are not shown in FIG. 2 for reasons of graphical clarity. As examples, the adaptive register circuit may comprise a triggering event input and a test enable input. Of these a triggering event input allows the register circuit to receive a triggering signal, a triggering edge of which defines an allowable time limit before which a digital value must appear at said data input to become temporarily stored. The triggering signal is often referred to as the clock signal. The register circuit may be e.g. of the type that is triggered at each rising edge of the clock signal. In such a case the allowable time limit means that the digital value at the data input 202 must settle within a certain time window, defined in relation to the rising edge of the clock signal, in order to become correctly temporarily stored in the adaptive register circuit.

A case in which the digital value at the data input 202 changes too late, i.e. after said allowable time limit, is called a timing event. In order to monitor for timing events the adaptive register circuit of FIG. 2 comprises a monitor circuit 207. It can be described as a timing event observation (TEO) logic configured to output a timing event observation (TEO) signal at an output of said register circuit as an indicator of the digital value at the data input 202 having changed too late. A more accurate definition of "too late" in this respect is "within a time window that begins at said allowable time limit and is shorter than one cycle of said triggering signal". How the monitor circuit 207 is implemented is of lesser importance, as long as it is capable of performing the operations that are described in this text. Examples of how a monitor circuit could be implemented can be found for example in an earlier-filed patent application number PCT/FI2017/050290.

The lower switch 205 at the output of the adaptive register circuit in FIG. 2 can be used to selectively direct the digital values at the data output 203 to regular use in normal operating mode ("functional outputs") or to the collection of test values ("test outputs"). Similarly the upper switch 206 at the output of the adaptive register circuit in FIG. 2 can be used to selectively direct the digital values at the TEO output to regular use in normal operating mode ("functional TEO outputs") or to the collection of test values ("test TEO outputs").

As illustrated in the upper part of FIG. 2, a TEST ENABLE or other corresponding input signal may be used to control the input and output connections (i.e. the switches 204, 205, and 206) of the adaptive register circuit, as well as its internal operation. This means that the adaptive register circuit is DFT (Designed For Testability, or Design-For-Test). As illustrated in the lower part of FIG. 2, selected and set values of operating parameters in the adaptive microelectronic circuit may affect the operating voltage, clock speed, and other operating parameter values that also affect the operation of the adaptive register circuit of FIG. 2. This explains why it is an "adaptive" register circuit.

The use of monitors (or: "TEO logic configured to output a TEO signal at an output of the register circuit as an indicator of the digital value at the data input having changed too late") is not the only possibility for combining DFT and adaptability on the level of circuit elements. FIG. 3 illustrates schematically an alternative, namely the use of replica paths.

In FIG. 3 the adaptive register circuit comprises the register circuit proper, i.e. the temporary storage for a digital value, shown as 301. Its data input and data output are shown as 302 and 303 respectively. A test input arrangement of the adaptive microelectronic circuit is represented by the first switch 304, which can be used to selectively couple functional input signals (during normal operating mode) or test input signals (during test mode) to the data input 302. A test output arrangement of the adaptive microelectronic circuit is represented by the second switch 305, configured to controllably collect test output values from the data output 303 adaptive register circuit to form test output signals. In normal operating mode the second switch 305 directs the digital values at the data output 303 to regular use.

A replica path 311 is provided within the same adaptive microelectronic circuit. The replica path 311 is as exact a copy of the register circuit proper 301 as possible, with the exception that its data input 312 is coupled to receive a predetermined test input value, and its data output 313 is fixedly coupled to deliver test output values to the forming of test output signals. The idea of using a replica path 311 is that it imitates the operation of the actual part, so that if the operation of the replica path begins to cause events, it is likely that events happen also in the operation of the actual part. Events in the operation of the replica path are easier to detect, because the input values to each replica path are predetermined and known. Since two circuit elements are never exactly equal, a so-called replica path margin may be added to the operation of the replica path 311. The use of a replica path margin means that the replica path 311 is deliberately made slightly slower and/or dependent on a slightly higher operating voltage than the actual part, so that when clock speed is increased and/or operating voltage lowered, timing events are most likely to become visible in the operation of the replica path 311 first.

As illustrated in the upper part of FIG. 3, a TEST ENABLE or other corresponding input signal may be used to control the input and output connections (i.e. the switches 304 and 305) of the adaptive register circuit, as well as its internal operation like switching the replica path 311 on or off. This means that the adaptive register circuit is DFT (Designed For Testability, or Design-For-Test). As illustrated in the lower part of FIG. 3, selected and set values of operating parameters in the adaptive microelectronic circuit may affect the operating voltage, clock speed, replica path margin, and other operating parameter values that also affect the operation of the adaptive register circuit of FIG. 3. This explains why it is an "adaptive" register circuit.

The combination of DFT and adaptivity can be utilized in many ways. Examples of such ways are illustrated in FIGS. 4 and 5.

Figure 4:
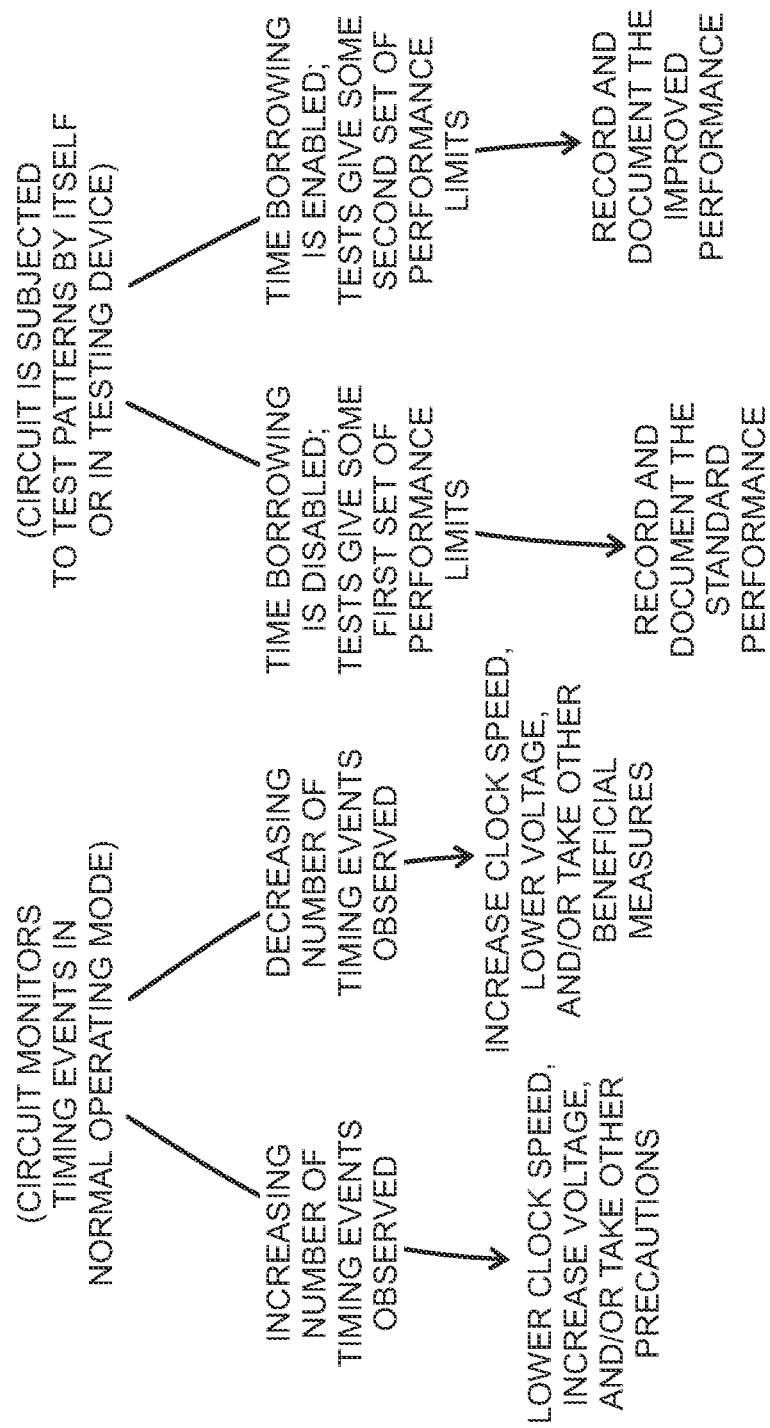
FIG. 4 illustrates some advantageous uses of adaptability and DFT.
Figure 5:
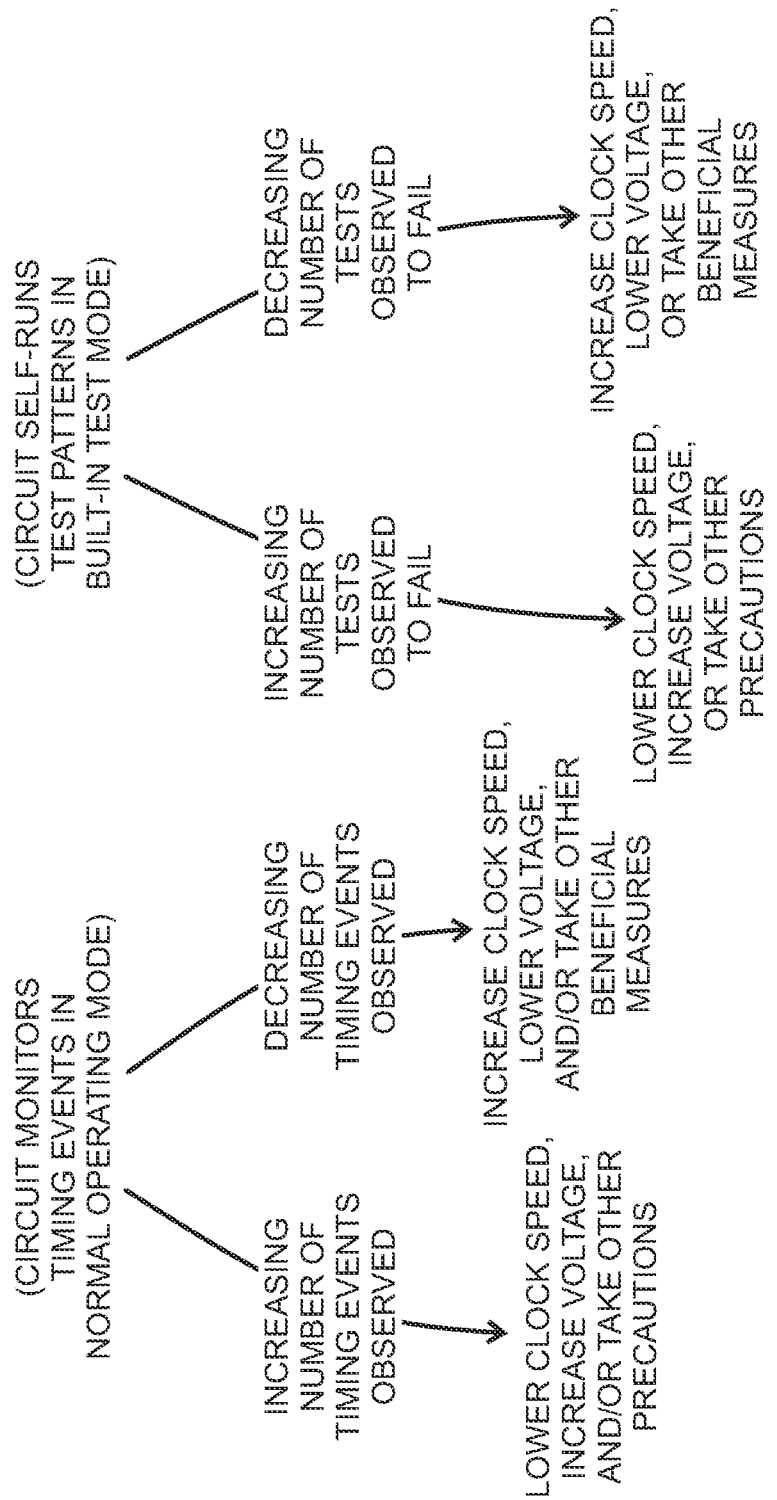
FIG. 5 illustrates some further advantageous uses of adaptability and DFT.

The left-hand side of FIG. 4 illustrates a method for dynamically optimizing the performance of an adaptive microelectronic circuit, first without utilizing its DFT characteristics. Here it is additionally assumed that the adaptive microelectronic circuit is equipped with circuit elements of the type explained above with reference to FIG. 2, so that the occurrence of timing events may be monitored by monitoring the value (s) appearing at the TEO output(s). This method is executed while the adaptive microelectronic circuit is operating in its normal operating mode. If an increasing number of timing events are observed, a control entity of the adaptive microelectronic circuit lowers the clock speed, increases the operating voltage, and/or takes some other precautionary action that aims at curbing the increase of timing events, even if it means increasing the power consumption. Correspondingly if a decreasing or zero number of timing events are observed, the control entity increases the clock speed, lowers the operating voltage, and/or takes some other beneficial action that aims at lowering power consumption, increasing the processing speed, or achieving some other advantageous performance goal while continuing to monitor that the number of timing events does not increase to unacceptable levels.

The right-hand side of FIG. 4 illustrates a method for characterizing the same adaptive microelectronic circuit, utilizing its DFT characteristics. The adaptive microelectronic circuit is operated in test mode, either by itself (if it is capable of generating and analyzing the test signals by itself) or in combination with a testing device, for example at the end of a manufacturing line where freshly manufactured microelectronic circuits should be characterized.

The left branch represents operation with time borrowing disabled. In other words, even if register circuits of the adaptive microelectronic circuit are equipped with monitors like in FIG. 2, these are temporarily switched off or their TEO outputs are not used. Different values for the operating parameters are tried; more formally it can be said that at least a first and a second operating parameter value are consecutively set for a particular operating parameter. A first test result is formed on the basis of examining a first set of test output signals formed when said operating parameter had said first operating parameter value. A second test result is formed on the basis of examining a second set of test output signals formed when said operating parameter had said second operating parameter value. A characterization value can be formed, indicative of the difference between the first and second test results.

This way of testing can be repeated, varying the operating parameter value, until it becomes clear what ranges of the operating parameter value result in acceptable and unacceptable performance respectively. For example, the operating parameter may be clock speed, and the testing can be repeated at various clock speeds, until a first performance limit is found: beyond some critical clock speed the adaptive microelectronic circuit makes so many errors in the test that its performance becomes unacceptable. Since time borrowing was disabled, the found first performance limit can be recorded and documented as the "standard" or "nominal" performance of the adaptive microelectronic circuit.

The right branch represents operation with time borrowing enabled. Now the monitors of the register circuits are switched on and their TEO outputs are used. The utilization of the TEO outputs typically allows the adaptive microelectronic circuit to perform appropriately at higher clock speeds and/or lower operating voltages. Thus when the same tests are repeated, it is likely that a more advantageous, second performance limit is found. This can be recorded and documented as the "improved" performance of the adaptive microelectronic circuit, the improvement being a result of the effective utilization of time borrowing in the appropriately equipped register circuits.

Above the characterization of the whole microelectronic circuit was considered, but similar methods can be used to characterize smaller parts, like an individual adaptive processing path within the microelectronic circuit. The first and second operating parameter values can be set such that the first operating parameter value has a different effect on the performance of said adaptive processing path than said second operating parameter value. The differences in performance can be noted, recorded, and documented as a characterization of how much the DFT and time-borrowing capabilities of the adaptive processing path improve its performance.

Characterization made in the way illustrated in FIG. 4 can be utilized for example to perform so-called binning. The manufacturer of adaptive microelectronic circuits may want to bin for example newly manufactured adaptive microelectronic circuits into performance bins on the basis of their circuit-specific characterization values obtained in the way explained above.

The performance bins may comprise a voltage bin for microelectronic circuits for which the corresponding characterization value indicates acceptable minimum operating voltage for a given clock speed. In other words, if there is specified a clock speed at which the microelectronic circuit should perform acceptably, individual microelectronic circuit units can be placed into voltage bins according to the minimum operating voltage that they need to exhibit the required performance. The units binned to the lowest voltage bin are typically the most valuable.

The performance bins may comprise a clock speed bin for microelectronic circuits for which the corresponding characterization value indicates acceptable maximum clock speed at a given operating voltage. This is a kind of inverse binning method compared to voltage binning: if there is a specified operating voltage at which the microelectronic circuit should perform acceptably, individual microelectronic circuit units can be placed into clock speed bins according to the maximum clock speed at which they still exhibit the required performance. The units binned to the highest clock speed bin are typically the most valuable.

The performance bins may comprise an energy bin for microelectronic circuits for which the corresponding characterization value indicates acceptable energy consumption for a combination of a minimum operating voltage and maximum clock speed. In other words, if both operating voltage and clock speed are specified, individual microelectronic circuit units can be placed into energy bins according to the energy consumption they exhibit at the specified values of the operating parameters. The units binned to the lowest energy bin are typically the most valuable.

FIG. 5 shows a comparison how the DFT capability of an adaptive microelectronic circuit can be utilized even in run-time during normal use when the microelectronic circuit has been used to build a larger electronic device. As illustrated in the left-hand part of FIG. 5 the circuit may use its timing event observation capability in normal operating mode to monitor the average number of timing events observed. If there appears to be an increasing trend, i.e. if more timing events seem to appear, it may mean that some environmental circumstance may have an increasingly disadvantageous effect: for example the ambient temperature may be on the rise, or an ongoing solar storm may cause a temporary increase in electromagnetic disturbance. Being adaptive, the circuit may react by lowering clock speed, by increasing the operating voltage, or by taking some other precautionary measures. In a corresponding way a decreasing trend in detected timing events may allow the circuit to increase clock speed, lower the operating voltage, or in some other way back down from previously taken precautions.

In the right-hand side it is shown how similar actions can be taken by not necessarily observing timing events, or at least not observing them during normal operating mode, but by temporarily employing a built-in test mode. The microelectronic circuit may utilize its built-in DFT capability to perform run-time tests, with similar aims and leading to similar consequences as the observation of timing events explained above. Operating in the built-in test mode does not need to take more than small fractions of a second, so the fact that the microelectronic circuit has a built-in DFT capability and that it uses it this way may go completely unnoticed by the user.

The practices shown on the left and on the right in FIG. 5 can be combined, for example so that if a change in the number of timing events is observed, this triggers a short excursion into the built-in test mode in order to more accurately measure what is actually happening. This way the microelectronic circuit may arrive at even more accurate conclusions and take even more effective and well-focused measures to meet the changes in environmental or other conditions that originally caused the observed change.

What is said here about observing timing events may be also applicable to observing errors that may have been caused by timing events.

Figure 6:
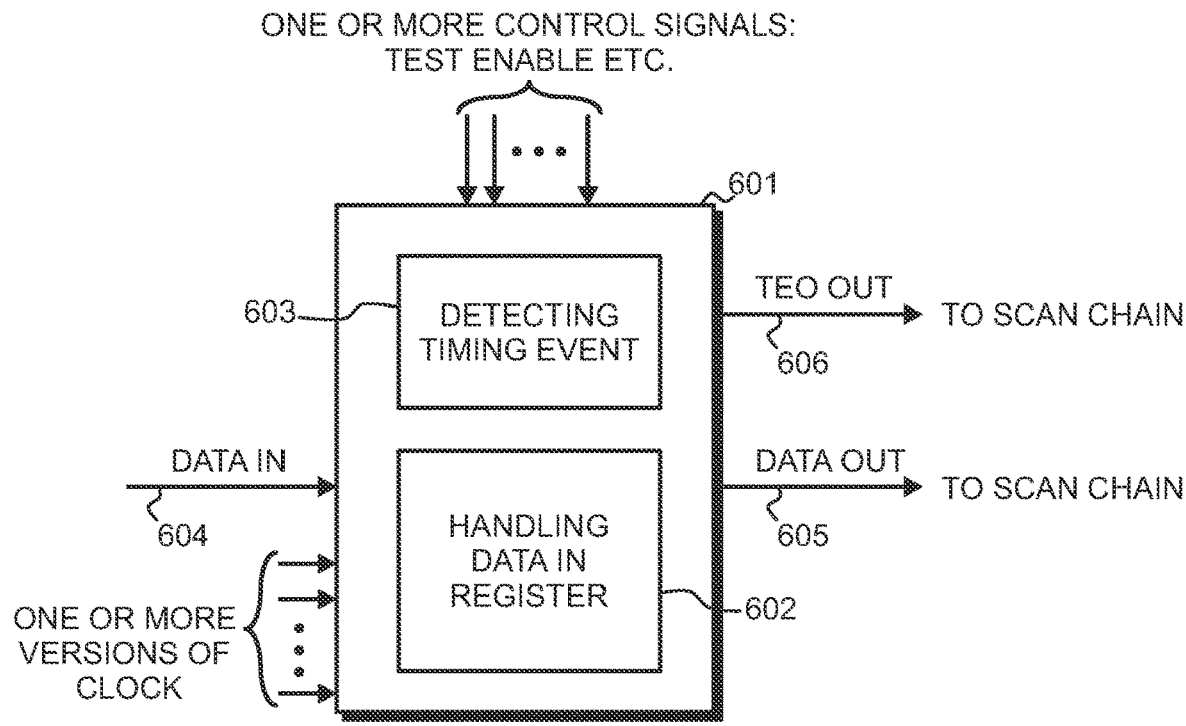
FIG. 6 illustrates schematically a register circuit with monitoring.

FIG. 6 illustrates an example of a register circuit 601 that has DFT characteristics and that may be adaptive, although that is not obligatory. Functional blocks of the register circuit 601 are the register circuit proper 602 and a monitor circuit or timing event observation stage 603. The data input 604, data output 605, and TEO output 606 operate in the same way as the correspondingly named parts in FIG. 2. As additional inputs there are one or more versions of triggering ("clock") signal inputs and one or more control signals related to the use of the test mode. Versions of the triggering or clock signal may comprise for example the actual clock signal and a delayed clock signal, so that the difference in time between the rising edges in the actual and delayed clock signals defines the TEO window. The concept "TEO window" refers to the time window that has been described earlier with reference to FIG. 2: if the digital value at the data input 604 changes during the TEO window, the timing event observation stage 603 notices this and produces a corresponding TEO output signal at the TEO output 606.

The DFT characteristics of the register circuit 601 include the possibility of directing the data output 605 and the TEO output 606 to a so-called scan chain. Such directing takes place in the test mode and is related to the DFT principle, in which a number of circuit elements are coupled together into a chain from which the test output values can be collected into a test output signal. There may be different scan chains for collecting the test output values from the data and TEO outputs, or there may be the possibility of selectively directing any of them to the same scan chain.

Figure 7:
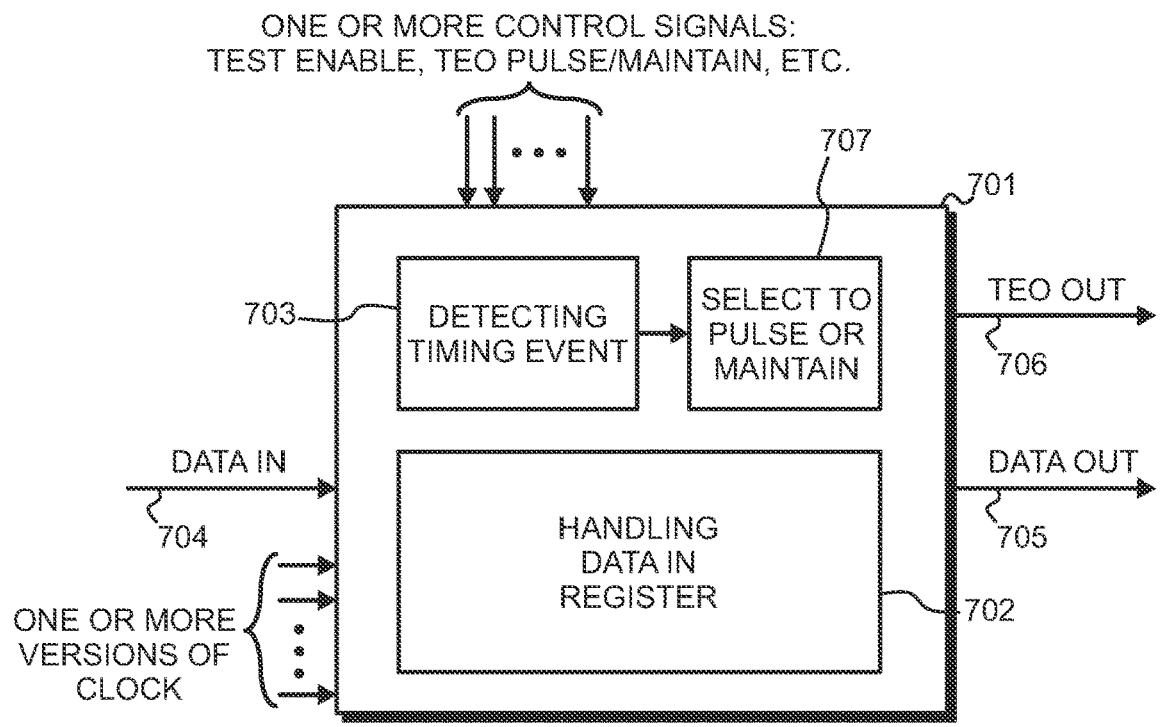
FIG. 7 illustrates schematically a register circuit with monitoring and TEO output value holding.

FIG. 7 illustrates an example of another register circuit 701 that has DFT characteristics and that may be adaptive but does not need to be. Functional blocks of the register circuit 701 are the register circuit proper 702 and a monitor circuit or timing event observation stage 703. The data input 704, data output 705, and TEO output 706 operate basically in the same way as the correspondingly named parts in FIGS. 2 and 6. As additional inputs there are one or more versions of triggering ("clock") signal inputs and one or more control signals related to the use of the test mode.

As a difference to FIG. 6 the register circuit 701 comprises the possibility of either pulsing or maintaining the value of the TEO output. The output of the timing event observation stage 703 is coupled to a controllable buffer 707 that also receives one of the control signals (seen at the top of FIG. 7). In response to the value of such a control signal the controllable buffer 707 either lets each momentary TE (Timing Event) flag from the timing event observation stage to pass at the rate determined by the clock signal, or freezes the value of the TEO signal for a longer period than one clock cycle in the clock signal. The latter possibility enables later collection of the frozen value of the TEO signal to form the set of test output signals described earlier in this text. Letting the TEO values pass at the rate determined by the clock signal is referred to as pulsing, while freezing a TEO value for a longer period than one clock cycle is referred to as maintaining.

There is also the possibility of selective maintaining of the value of the TEO output. The value of a control signal mentioned above may have an effect that the controllable buffer 707 only freezes the value of the TEO signal if it goes high. Non-selective maintaining could involve also freezing the low value of the TEO signal.

Figure 8:
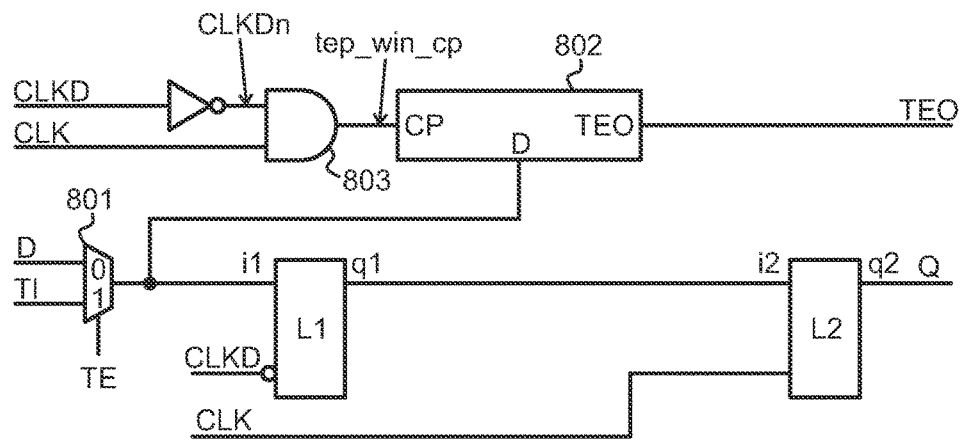
FIG. 8 illustrates an adaptive register circuit with a monitor and DFT characteristics.

FIG. 8 illustrates an example of a register circuit for temporarily storing a digital value obtained from an output of a preceding circuit element in a microelectronic circuit. The register circuit of FIG. 8 is DFT and adaptive. It comprises a data input for receiving said digital value for temporary storage: the data input is equipped with a multiplexer 801, which is responsive to a TE (Test Enable) signal by coupling either the functional input D or a test input TI into the register circuit. The register circuit comprises a data output D for outputting the temporarily stored digital value. Additionally it comprises two triggering event inputs CLK and CLKD for receiving triggering signals. The CLKD input is configured to receive a delayed version of the signal at the CLK input. A triggering edge in the CLK signal defines an allowable time limit before which a digital value must appear at said data input to become temporarily stored. On the data propagation path between the data input and the data output there is a sequence of a first subregister stage L1 and a second subregister stage L2. These are preferably pulse-enabled or level-enabled latches. In the following the term latch is used for a subregister stage for short. Also the terms pulse-enabled subregister stage or level-enabled subregister stage could be used.

The CLKD signal (or actually: its inverse) goes into the enabling input of the first latch L1. This means that the first latch L1 is configured to receive a triggering signal delayed with respect to the triggering signal CLK received by the second latch L2. The length of the delay is a fraction of a cycle of the triggering signal CLK.

The register circuit comprises a timing event observation logic 802 that is configured to output a TEO signal at the upper output of the register circuit as an indicator of the digital value at the data input having changed within a time window that begins at the allowable time limit mentioned above and is shorter than one cycle of the triggering signal CLK. The length of this so-called TEO window is the difference between a rising edge in the CLK signal and the immediately following rising edge in the CLKD signal. Since the CLK signal and the inverse CLKDn of the CLKD signal go into the inputs of an AND gate 803, the enabling signal tep_win_cp that goes into the CP input of the timing event observation logic 802 is high only during said two consecutive rising edges.

An example of a test that can be performed with register circuits of the kind shown in FIG. 8 is a TEO-stuck-at-one test. The aim of the test is to check whether there are any monitor circuits (i.e. timing event observation logics) in the microelectronic circuit that would have their TEO outputs stuck at the logical value one. This can be tested by activating the TE signal and feeding in a test pattern where the digital value does not change. Since the TEO output of a monitor circuit should only go high if the digital value at the data input changes too late, and since a test pattern of this kind involves no changes at all, all TEO outputs should remain low. If any of them gives a high value, it tells that at least one monitor circuit is faulty and its output is stuck high, i.e. stuck at logic value "1".

The register circuit of FIG. 8 can be adaptively responsive to values of operating parameters available to it. For example the operating voltage and/or the frequency of the CLK (and CLKD) signal can be changed, as well as the delay in the CLKD signal that defines the length of the window during which the timing event observation logic 802 reacts to late incoming data.

Figure 9:
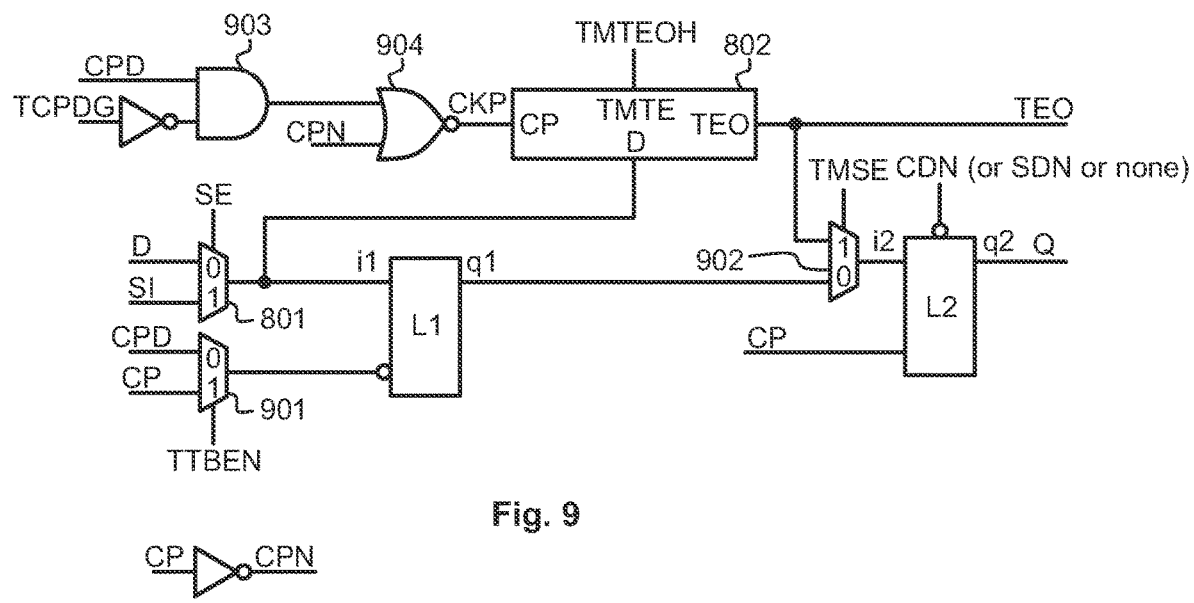
FIG. 9 illustrates an adaptive register circuit with a monitor and DFT characteristics.

FIG. 9 illustrates a slightly more elaborate register circuit that is adaptive and DFT. The triggering signal to the first latch L1 may be (the inverse of) either the same clock signal CP as the one that triggers the second latch L2 or a delayed version CPD thereof, depending on the value of the signal TTBEN that controls the triggering signal multiplexer 901. The TE signal of FIG. 8 is now replaced with a similarly working SE (Scan Enable) signal that controls the multiplexer 801 in the data input. The TI signal of FIG. 8 is renamed here as SI (Scan Input).

The CP is the normal triggering (i.e. clock) signal in FIG. 9, CPN is its inverse, and CPD is its delayed version. The TTBEN signal selects whether timing event observation is in use or not, because a value "1" of TTBEN causes the first and second latches L1 and L2 to be triggered exactly in synchronism so that no time borrowing can be made. Thus having TTBEN high enables testing the operation of the register circuit as if it did not include any time borrowing.

The TMSE (Test Monitor Scan Enable) signal controls the multiplexer 902 at the input of the second latch L2. Its effect is to direct either the intermediate data value q1 from the output of the first latch L1 or the TEO signal from the output of the monitor circuit 802 to the second latch L2. This makes it possible to implement the microelectronic circuit with only one test output arrangement that is configured to controllably collect test output values from a plurality of circuit elements: depending on the value of TMSE, either the data outputs or the TEO outputs are collected.

The TMTEOH (Test Mode Timing Event Observation Hold) signal can be used for freezing the value of the TEO signal for a longer period than one clock cycle in the clock signal CP. This enables later collection of the frozen value of the TEO signal to form the desired set of test output signals. The CDN signal is an asynchronous reset that can be used to reset the output of the second latch L2.

The TEO-stuck-at-one test can be made in FIG. 9 in the same way as above in FIG. 8. In FIG. 9 there is the additional possibility of finding out, which of the register circuits had its monitor output stuck at a high value. Namely, if the TEO outputs of all monitors in the register circuits of the scan chain all just go to an OR tree, its output goes high if at least one TEO output goes high, but there is no way of telling which of them it was. In the arrangement of FIG. 9 setting the TMTEOH high freezes the value of each TEO output signal, and since they are captured through the multiplexer 902 and the second latch L2 and clocked out, from the outcoming test signal it can be counted, at which point (i.e. since which register circuit in the scan chain) it has a high value. This enables also determining whether the problem was in a monitor or in the OR-tree that is used to combine the TEO outputs of the monitors.

The arrangement of FIG. 9 also allows performing a TEO-stuck-at-zero test. For this purpose the TCPDG (Test Clock Pulse Delay Gated) is used. Normally its value is zero, so the output of the AND gate 903 follows the value of the CPD signal. A NOR gate 904 that uses the output of the AND gate 903 and the inverse clock signal CPN as its inputs produces a high pulse between each rising edge of the CP signal and the immediately following high edge of the CPD pulse, thus defining the TEO window for the monitor circuit 802. If the TCPDG signal assumes a high value, the output of the AND gate 903 remains constantly low, and the CKP signal is essentially an inverse of the CPN signal, i.e. equal to the direct clock signal CP. This in turn means that when TCPDG is high, the monitoring window applied by the monitor circuit 802 is half a clock cycle long, i.e. as long as each high pulse in the clock signal CP. Depending on the clocking rate used in the test, this half of a clock cycle may be longer than the clock period in functional mode. Propagating a test vector with only one bit at a high value and all others low should now trigger each monitor circuit at a time in the scan chain. If one of them is stuck at zero, the corresponding anomaly will be noticed in the test output signal collected from the scan chain.

Figure 10:
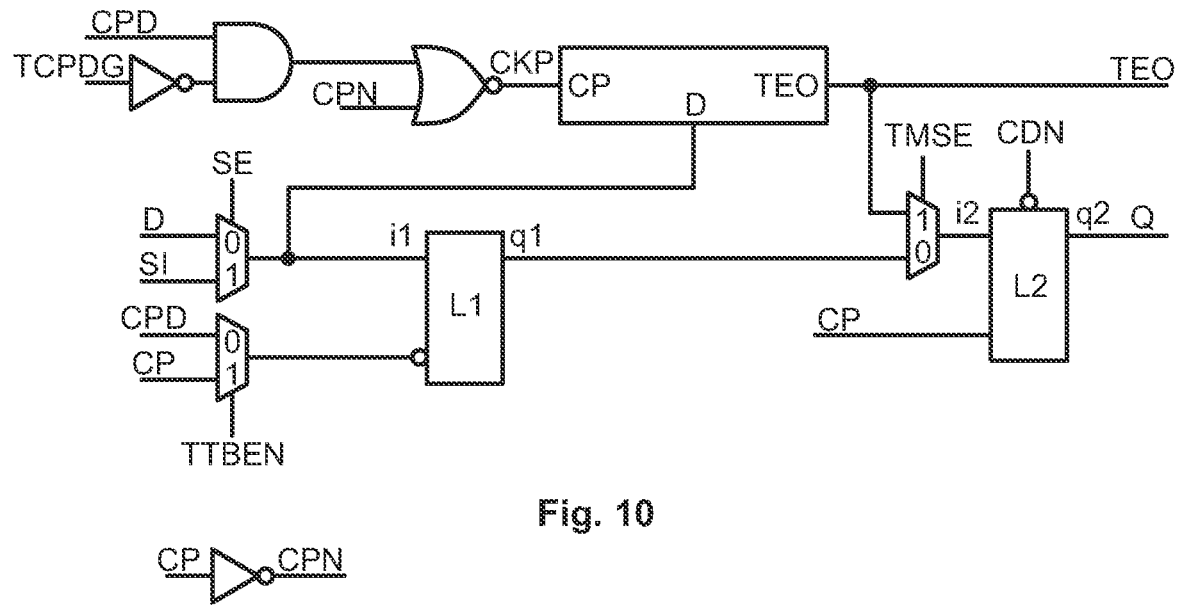
FIG. 10 illustrates an adaptive register circuit with a monitor and DFT characteristics.
Figure 10:
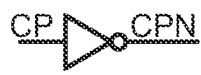
Figure 11:
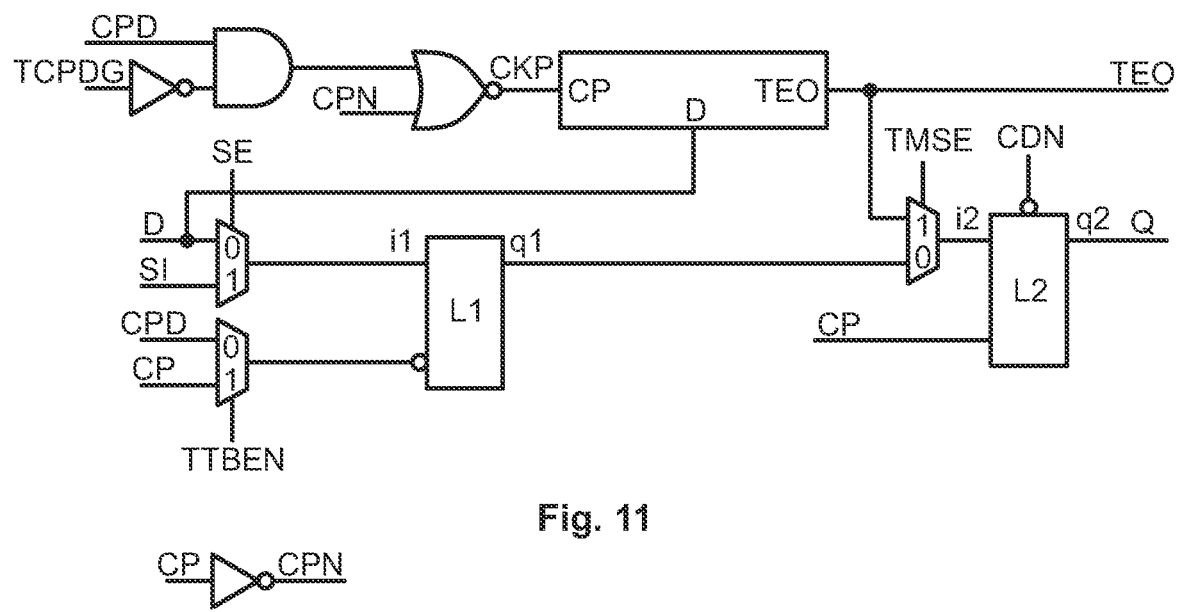
FIG. 11 illustrates an adaptive register circuit with a monitor and DFT characteristics.
Figure 11:
Figure 12:
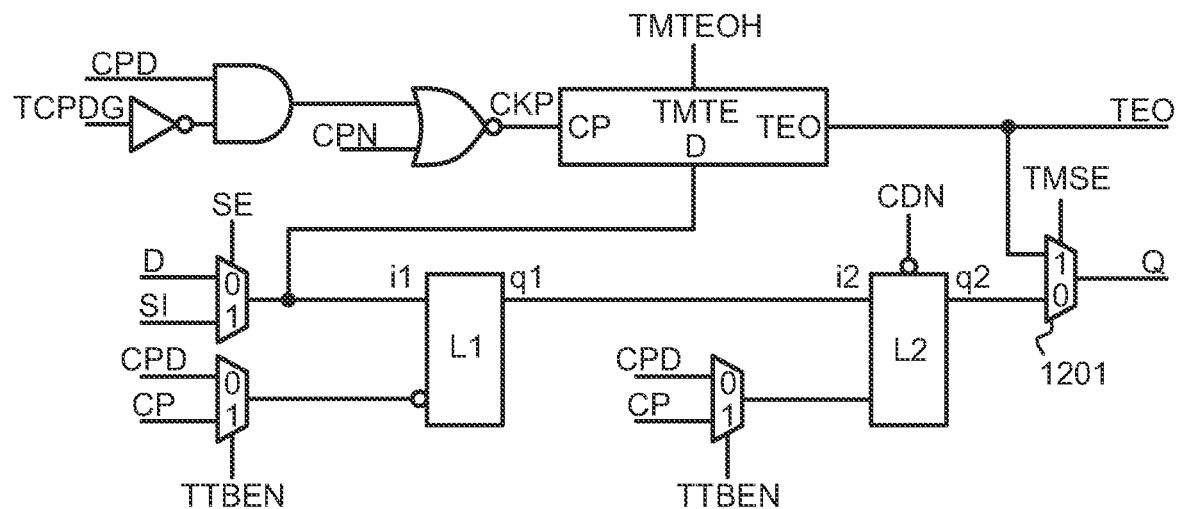
FIG. 12 illustrates an adaptive register circuit with a monitor and DFT characteristics.
Figure 12:
Figure 13:
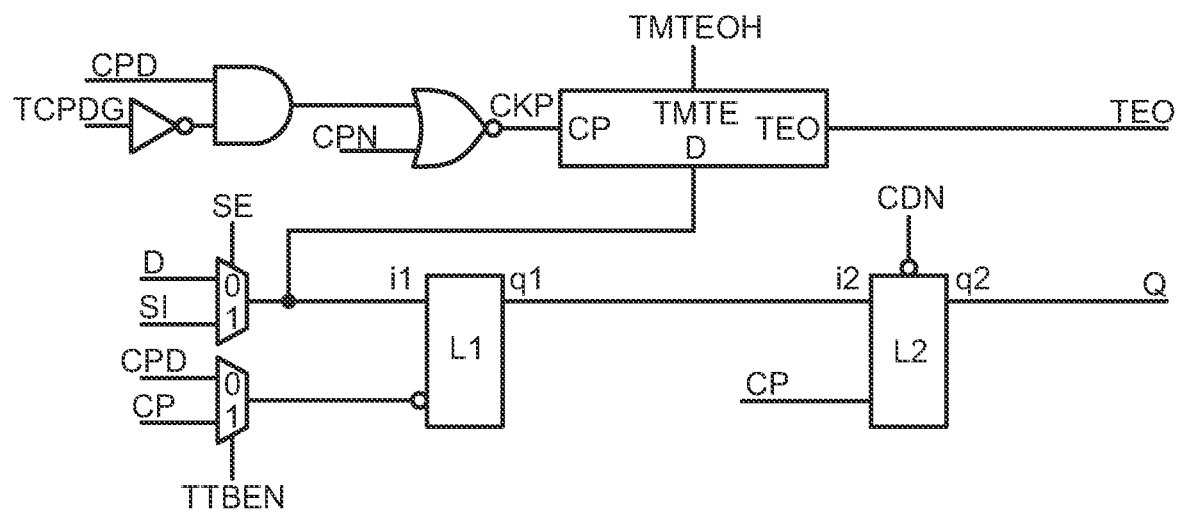
FIG. 13 illustrates an adaptive register circuit with a monitor and DFT characteristics.
Figure 13:

FIG. 10 illustrates a variation of the register circuit of FIG. 9, this time without the TMTEOH input signal; it is not necessary if the corresponding functionality is not considered obligatory. FIG. 11 illustrates a variation that is otherwise similar but the data input to the monitor circuit comes from the functional data input D of the register circuit instead of the output of the data input multiplexer as in FIGS. 9 and 10. FIG. 12 illustrates a variation in which both the first latch L1 and the second latch L2 can be clocked selectively with either the CP or the CPD signals depending on the value of the TTBEN signal. Additionally in FIG. 12 the output multiplexer 1201 is placed after the second latch L2 and not before it like in the previous embodiments. FIG. 13 illustrates a variation in which the TMTEOH signal is present, but the data and TEO outputs are not multiplexed together; both are directed to scan chains of their own.

Figure 14:
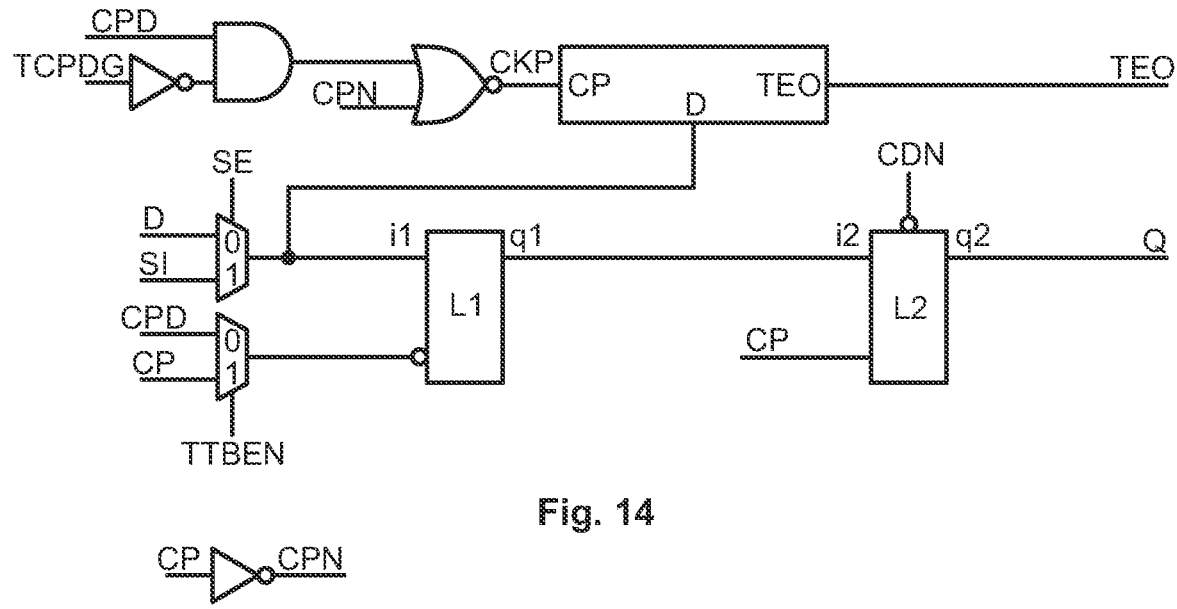
FIG. 14 illustrates an adaptive register circuit with a monitor and DFT characteristics.
Figure 15:
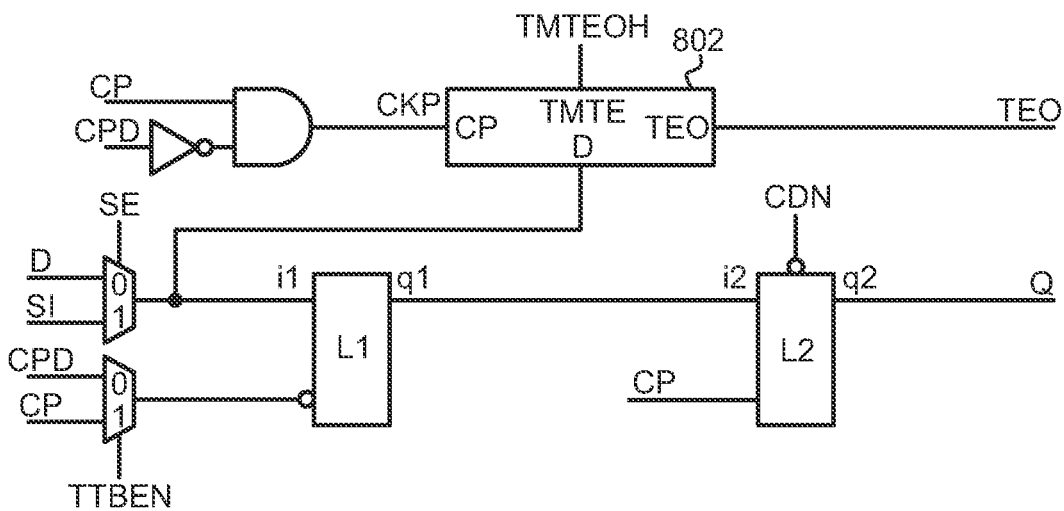
FIG. 15 illustrates an adaptive register circuit with a monitor and DFT characteristics.
Figure 16:
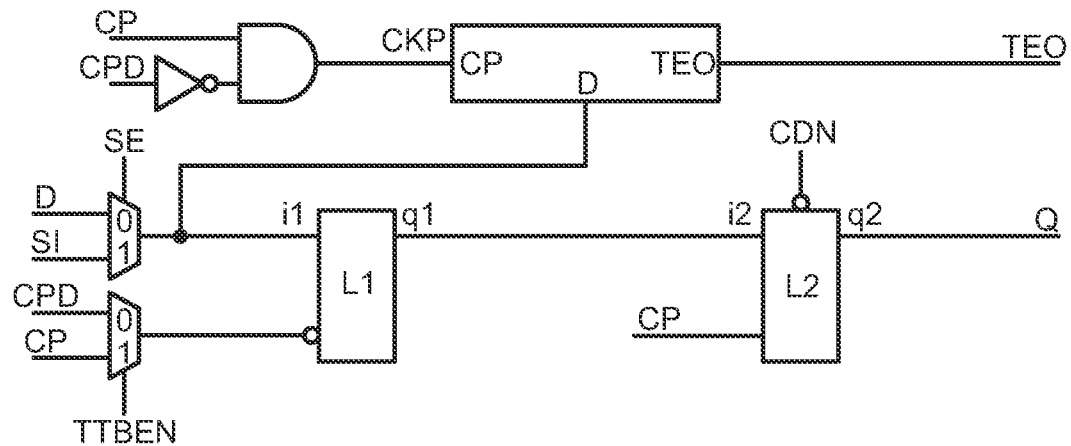
FIG. 16 illustrates an adaptive register circuit with a monitor and DFT characteristics.
Figure 17:
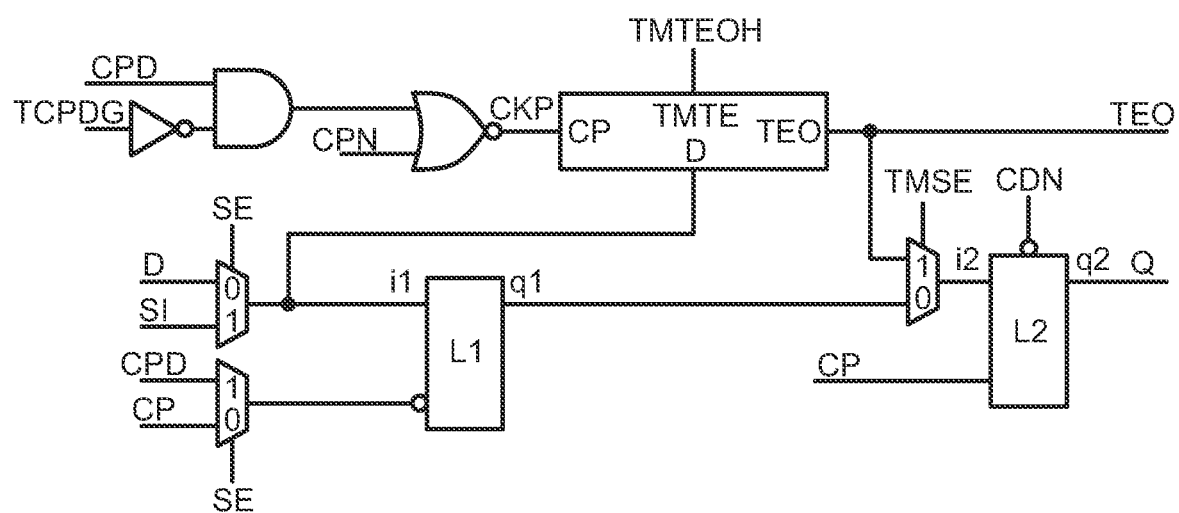
FIG. 17 illustrates an adaptive register circuit with a monitor and DFT characteristics.
Figure 18:
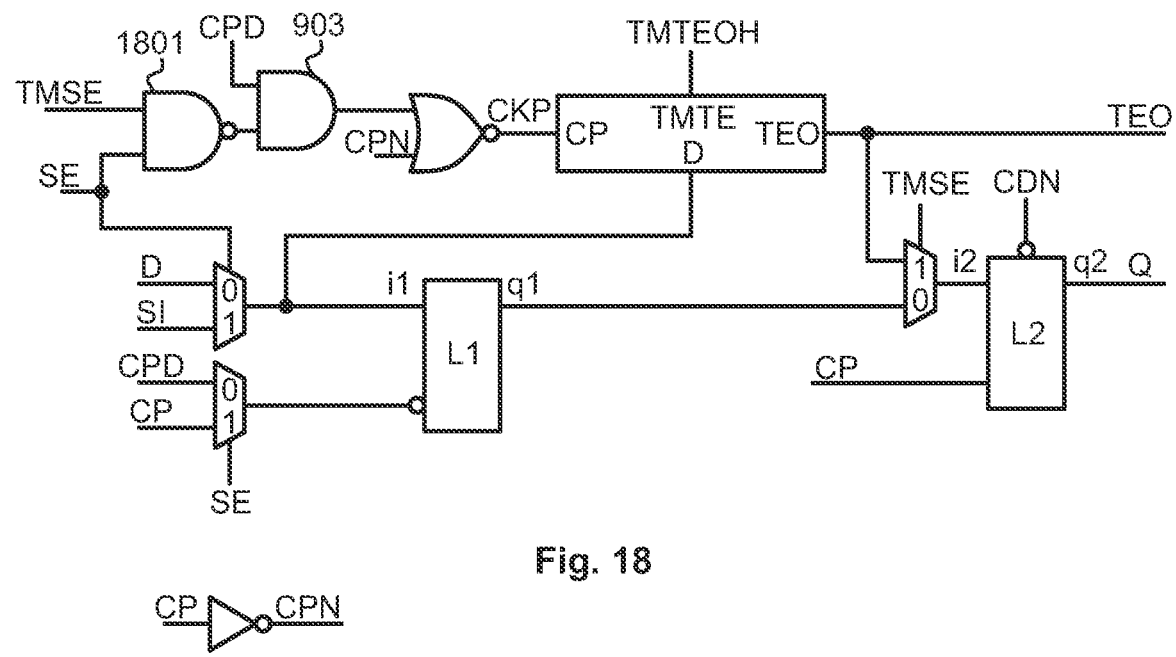
FIG. 18 illustrates an adaptive register circuit with a monitor and DFT characteristics.

FIG. 14 illustrates a variation in which the TMTEOH signal is not used and there is no output multiplexer. FIG. 15 illustrates a variation in which the clock pulse signal to the monitor circuit 802 is produced in a simpler way, so that it is simply an AND result of the CP and inverted CPD signal. FIG. 16 illustrates the same but without the TMTEOH signal, and FIG. 17 illustrates a variation in which the SE signal is used instead of the TTBEN signal to control the clock signal multiplexed at the input. FIG. 18 illustrates a variation in which this use of the SE signal is the same, and additionally the SE signal is used as an input to a NAND gate 1801 to which the TMSE signal comes as the other input. The output of the NAND gate 1801 goes as one input to the AND gate 903 in the logic that eventually forms the CKP signal; the other input to the AND gate 903 is the CPD signal.

A feature common to all of FIGS. 9 to 18 is that they disclose monitor circuits for detecting timing events in a register circuit of a microelectronic circuit. In each case the monitor circuit comprises a triggering event input for receiving a triggering signal, like a clock signal or a pulsed clock signal. A triggering edge of such a triggering signal defines an allowable time limit before which a digital value must appear at a data input of the register circuit to become temporarily stored in said register circuit. The triggering event input is marked as CP in the drawings. Also in each case the monitor circuit comprises a monitoring input for receiving a monitoring copy of the digital value in question at the same timing as at which said digital value appears at the data input of the register circuit. The monitoring input is marked as D in the drawings.

Also in each case the monitor circuit comprises a timing event observation output, marked as TEO. A timing event observation logic within the monitor circuit is configured to output a timing event observation signal at the TEO output as an indicator of the digital value at the data input of the register circuit having changed late. Here the definition of "late" is "within a time window that begins at said allowable time limit and is shorter than one cycle of said triggering signal".

In each case the monitor circuit comprises an output handling unit that is configured to enable collecting values of said timing event observation signal for further processing outside the monitor circuit. In each case the monitor circuit is also adaptive, meaning that it is adaptively responsive to values of operating parameters made available to said monitor circuit.

The embodiments shown in FIGS. 9 to 18 differ somewhat from each other concerning the ways in which the output handling unit or output handling functionality is implemented. In the embodiments with an input in the monitor circuit for the TMTEOH signal the output handling unit can be said to comprise a control input for receiving an output freezing command, and the monitor circuit can be said to be configured to respond to a received output freezing command by holding a current value of said timing event observation signal constant. In FIGS. 9-12 and 17-18 the output handling unit comprises a multiplexer that is configured to selectively direct a value of said timing event observation signal to a scanning chain outside said monitor circuit instead of a data output value of the register circuit proper.

It is obvious to a person skilled in the art that with the advancement of technology, the basic idea of the invention may be implemented in various ways. The invention and its embodiments are thus not limited to the examples described above, instead they may vary within the scope of the claims.

The invention claimed is:

1. A method for operating an adaptive microelectronic circuit, performance of which is configurable through making an operating parameter assume an operating parameter value, the method comprising:
   selectively setting the microelectronic circuit into a test mode that differs from a normal operating mode of the microelectronic circuit,
   utilizing said test mode to input test input signals consisting of test input values into one or more adaptive processing paths within the microelectronic circuit, wherein an adaptive processing path comprises processing logic and register circuits configured to produce output values from input values input to them, and wherein the performance of such an adaptive processing path can be configured by making an operating parameter assume an operating parameter value, making said one or more adaptive processing paths form test output values on the basis of the respective test input values input to them, and forming a set of test output signals by collecting said test output values given by said one or more adaptive processing paths, examining said set of test output signals, and forming a test result on the basis of said examining, and using said test result to select and set an operating parameter value for said operating parameter.

2. A method according to claim 1, wherein the operating parameter value that is set is made to affect the performance of said one or more adaptive processing paths.

3. A method according to claim 1, comprising characterizing said microelectronic circuit by:

consecutively setting at least a first and a second operating parameter value for said operating parameter, forming a first test result on the basis of examining a first set of test output signals formed when said operating parameter had said first operating parameter value, forming a second test result on the basis of examining a second set of test output signals formed when said operating parameter had said second operating parameter value, and forming a characterization value indicative of difference between said first and second test results.

4. A method according to claim 3, comprising characterizing an adaptive processing path within said microelectronic circuit by setting said first and second operating parameter values such that said first operating parameter value has a different effect on the performance of said adaptive processing path than said second operating parameter value.

5. A method according to claim 3, comprising binning the microelectronic circuit into a performance bin on the basis of said characterization value.

6. A method according to claim 5, wherein said performance bin is at least one of the following:

a voltage bin for microelectronic circuits for which the corresponding characterization value indicates acceptable minimum operating voltage for a given clock speed, a clock speed bin for microelectronic circuits for which the corresponding characterization value indicates acceptable maximum clock speed at a given operating voltage, an energy bin for microelectronic circuits for which the corresponding characterization value indicates acceptable energy consumption for a combination of a minimum operating voltage and maximum clock speed.

7. A method according to claim 1, wherein:

said adaptive processing path comprises a register input, a clock input, a register output, and a timing event output, said adaptive register circuit comprises a data storage between said register input and said register output for temporarily storing a data value appearing at said register input at an allowable time limit in relation to a clock signal appearing at said clock input, said adaptive register circuit comprises a timing event observation stage configured to output a timing event observation signal at said timing event output in response to a change in the data value at said register input that took place later than said allowable time limit in relation to said clock signal, and the method step of forming a set of test output signals comprises collecting output values given by said timing event observation stage.

8. A method according to claim 7, comprising:

freezing the value of said timing event observation signal for a longer period than one clock cycle in said clock signal, for later collection of the frozen value of said timing event observation signal to form said set of test output signals.

9. A method according to claim 7, comprising:

temporarily disabling operation of said timing event observation stage, inputting said test input values through said register input into said data storage, and collecting the test output values given at said register output;

for testing the operation of the data storage independent of the operation of the timing event observation stage.

10. A method according to claim 1, in which method said test mode comprises at least one standardized DFT test mode, including but not being limited to stuck-at-fault testing, at-speed-fault testing.

11. A microelectronic circuit comprising:

a processing path, said processing path comprising circuit elements such as processing logic and register circuits, and said processing path being adaptively responsive to values of operating parameters made available to said circuit elements, a test input arrangement configured to controllably feed test input signals consisting of test input values into a plurality of circuit elements of said processing path, a test output arrangement configured to controllably collect test output values from said plurality of circuit elements of said processing path, and an operating parameter value selector configured to select said values of said operating parameters on the basis of said collected test output values.

12. A microelectronic circuit according to claim 11, wherein:

one of said circuit elements is a register circuit that comprises a first subregister stage and a second subregister stage in series along a data propagation path, said register circuit comprises a triggering event input for receiving a triggering signal, a triggering edge of which is to define an allowable time limit before which a digital value must be appear at a data input of said first subregister stage to become temporarily stored and said register circuit comprises a timing event observation stage coupled to said data propagation path and configured to output a timing event observation signal at an output of said register circuit as an indicator of said digital value at said data input having changed within a time window that begins at said allowable time limit and is shorter than one cycle of said triggering signal.

13. A microelectronic circuit according to claim 12, wherein said test output arrangement is configured to controllably collect test output values from a data output of said register circuit that is an output of said second subregister stage.

14. A microelectronic circuit according to claim 12, wherein said test output arrangement is configured to controllably collect values of said timing event observation signal as said test output values.

15. A microelectronic circuit according to claim 11, wherein said operating parameters comprise at least one of: an operating voltage, a clock speed.

16. A register circuit for temporarily storing a digital value obtained from an output of a preceding circuit element in a microelectronic circuit, the register circuit comprising:
   a data input for receiving said digital value for temporary storage,
   a data output for outputting the temporarily stored digital value,
   a triggering event input for receiving a triggering signal, a triggering edge of which defines an allowable time limit before which a digital value must appear at said data input to become temporarily stored, and
   on the data propagation path between said data input and data output a sequence of a first subregister stage and second subregister stage;
wherein said first subregister stage is configured to receive said triggering signal delayed with respect to the triggering signal received by said second subregister stage, the length of the delay being a fraction of a cycle of said triggering signal,
and wherein said register circuit comprises a timing event observation logic configured to output a timing event observation signal at an output of said register circuit as an indicator of said digital value at said data input having changed within a time window that begins at said allowable time limit and is shorter than one cycle of said triggering signal,
and wherein said register circuit is adaptively responsive to values of operating parameters made available to said register circuit.

17. A monitor circuit for detecting timing events in a register circuit of a microelectronic circuit, the monitor circuit comprising:
   a triggering event input for receiving a triggering signal, a triggering edge of which defines an allowable time limit before which a digital value must appear at a data input of said register circuit to become temporarily stored in said register circuit,
   a monitoring input for receiving a monitoring copy of said digital value at the same timing as at which said digital value appears at said data input of said register circuit,
   a timing event observation output, and
   a timing event observation logic configured to output a timing event observation signal at said timing event observation output as an indicator of said digital value at said data input having changed within a time window that begins at said allowable time limit and is shorter than one cycle of said triggering signal;
wherein the monitor circuit comprises an output handling unit configured to enable collecting values of said timing event observation signal for further processing outside the monitor circuit, and wherein said monitor circuit is adaptively responsive to values of operating parameters made available to said monitor circuit.

18. A monitor circuit according to claim 17, wherein said output handling unit comprises a control input for receiving an output freezing command, wherein said monitor circuit is configured to respond to a received output freezing command by holding a current value of said timing event observation signal constant.

19. A monitor circuit according to claim 17, wherein said output handling unit comprises a multiplexer configured to selectively direct a value of said timing event observation signal to a scanning chain outside said monitor circuit instead of a data output value of said register circuit.

* * * * *